US006958639B2

(12) United States Patent
Park et al.

(10) Patent No.: US 6,958,639 B2
(45) Date of Patent: Oct. 25, 2005

(54) DIGITAL DUTY CYCLE CORRECTION CIRCUIT AND METHOD FOR MULTI-PHASE CLOCK

(75) Inventors: Hong June Park, Pohang (KR); Young Chan Jang, Daegu (KR); Seung Jun Bae, Daejeon (KR)

(73) Assignee: Postech Foundation, Kyungsangbuk-do (KR)

( * ) Notice: Subject to any disclaimer, the term of this patent is extended or adjusted under 35 U.S.C. 154(b) by 0 days.

(21) Appl. No.: 10/774,398

(22) Filed: Feb. 10, 2004

(65) Prior Publication Data

US 2005/0007168 A1 Jan. 13, 2005

(30) Foreign Application Priority Data

Jul. 10, 2003 (KR) ..................... 10-2003-0046864

(51) Int. Cl.[7] ............................................ H03K 3/017
(52) U.S. Cl. ...................................... 327/175; 327/172
(58) Field of Search ................................ 327/170–175

(56) References Cited

U.S. PATENT DOCUMENTS 5,610,548 A * 3/1997 Masleid ...................... 327/374
6,275,952 B1 * 8/2001 Kachi ......................... 713/500
6,496,552 B2 * 12/2002 Tomofuji et al. ........... 375/373

* cited by examiner

*Primary Examiner*—Timothy P. Callahan
*Assistant Examiner*—Cassandra Cox
(74) *Attorney, Agent, or Firm*—Rothwell, Figg, Ernst & Manbeck

(57) ABSTRACT

Provided is a digital duty cycle correction circuit and method for a multi-phase clock, in which duty cycle correction information of an input clock signal is stored in a power save state of a system by adopting a digital correction method in a duty cycle correction method for a multi-phase clock and phase information of the input clock signal is held constant during duty cycle correction of the input clock signal by correcting duty cycles of the input clock signal by changing the falling edge of the clock without changing the rising edge of the input clock signal during duty cycle correction of the input clock signal, thereby correcting the multi-phase clock. To this end, the digital duty cycle correction circuit includes a clock delay means that takes the form of a shunt capacitor-inverter, a clock generation means including a clock rising edge generation circuit and a clock falling edge generation circuit, and a digital duty cycle detection means including integrators, a comparator, and a counter/register.

5 Claims, 5 Drawing Sheets

DIGITAL DUTY CYCLE CORRECTION CIRCUIT AND METHOD FOR MULTI-PHASE CLOCK

CROSS REFERENCE TO RELATED APPLICATION

This application claims the priority of Korean Patent Application No. 2003-46864, filed on Jul. 10, 2003, in the Korean Intellectual Property Office, the disclosure of which is hereby incorporated by reference in its entirety.

BACKGROUND OF THE INVENTION

1. Field of the Invention

The present invention relates to a digital duty cycle correction circuit and method for a multi-phase clock, and more particularly, to a digital duty cycle correction circuit and method for a multi-phase clock, in which duty cycle correction information of a clock is stored in a power save state of a system by adopting a digital correction method in a duty cycle correction method for a multi-phase clock and it becomes possible to perform correction for the multi-phase clock by maintaining phase information of the clock constant during duty cycle correction of the clock.

2. Description of the Related Art

As is well known to those skilled in this field, a clock with a duty cycle of 50% is required for various applications such as analog-to-digital converters (ADCs), double-data-rate (DDR) SDRAMs, phase-locked loops (PLLs), and delay-locked loops (DLLs) to which the clock is applied. If the duty cycle of the clock falls outside 50%, a performance of the ADCs and DDR SDRAMs is degraded and multi-phase DLLs and PLLs come to have phase offsets.

To solve such problems, an analog duty cycle correction circuit has been developed and is shown in FIG. 1. The analog duty cycle correction circuit of FIG. 1 includes a duty cycle correction unit 10 and a control voltage generation unit 20. The duty cycle correction unit 10 may be configured as shown in FIG. 2A and the control voltage generation unit 20 may be configured as shown in FIG. 2B.

Referring to FIGS. 1, 2A, and 2B, to have a clock duty cycle of 50%, the control voltage generation unit 20 generates an analog offset voltage that is proportional to a duty cycle different between differential clocks and applies the analog offset voltage to the duty cycle correction unit 10 so as to correct the duty cycle of a clock.

In the analog duty cycle correction circuit of FIG. 1, the analog offset voltage serves as duty cycle information for the clock and is stored in a large-capacitor load of an output of the control voltage generation unit 20, but the duty cycle correction information is lost in a power save state after the completion of clock duty cycle correction.

Also, to accurately generate the analog offset voltage proportional to the duty cycle difference between the differential clocks, the slopes of a rising edge and a falling edge of an input clock signal must be slow. As a result, it is difficult to correct the duty cycle of a high-speed clock and such duty cycle correction is sensitive to noise. Also, since the phases of both the rising edge of the input clock signal and the falling edge of the input clock signal change, phase information of a multi-phase clock does not remain constant.

SUMMARY OF THE INVENTION

The present invention provides a digital duty cycle correction circuit and method for a multi-phase clock, in which duty cycle correction information of an input clock signal is stored in a power save state of a system by adopting a digital correction method in a duty cycle correction method for a multi-phase clock and phase information of the input clock signal is maintained during duty cycle correction of the input clock signal by correcting duty cycles of the input clock signal by changing the falling edge of the clock signal without changing the rising edge of the input clock signal during duty cycle correction of the input clock signal, thereby correcting the multi-phase clock signal.

The present invention also provides a digital duty cycle correction circuit and method for a multi-phase clock, in which clock duty cycle correction is not affected by a duty cycle of an input clock signal by using only clock rising edge information for an input clock signal during clock duty cycle correction.

According to one aspect of the present invention, there is provided a digital duty cycle correction circuit comprising a clock delay means, a clock generation means including a clock rising edge generation means and a clock falling edge generation means, and a digital duty cycle detection circuit means including current integrators, a comparator, and a counter/register. The clock rising edge generation means detects a rising edge of an input clock signal and generates a rising edge of a duty cycle corrected clock signal. The clock falling edge generation means detects a rising edge of a clock signal that is 180° out of phase with the input clock signal and generates a falling edge of the duty cycle corrected clock signal based on the detected information. The current integrators of the digital duty cycle detection circuit means integrate the difference between a driving clock signal and a reference voltage. The comparator converts the outputs of the current integrators into a CMOS level. The counter/register decreases or increases a binary digital code of 4 bits according to the output of the comparator, thereby storing duty cycle information.

The clock rising edge generation means and the clock falling edge generation means are included in a pseudo-$C^2$MOS-inverter.

The falling edge of the duty cycle corrected clock signal is generated according to the rising edge of the inverted input clock signal that is inverted by 180° by the clock delay means.

The digital duty cycle correction circuit further comprises a clock driving circuit means that outputs and provides the duty cycle corrected clock signal to external circuits and a digital duty cycle detection circuit means that detects the duty cycle corrected clock signal output from the clock driving circuit means and inputs the corrected duty cycle information of clock signal to the clock delay means.

The duty cycle detection circuit means controls the clock delay means and outputs a predetermined digital code that inverts the phase of the rising edge of the input clock signal by 180° and generates the rising edge of the duty cycle corrected clock signal.

The duty cycle detection circuit means comprises two integrators, a comparator, and a counter/register. The two integrators integrate a difference between a predetermined clock signal and a reference voltage over one period of the predetermined clock signal. The comparator generates a predetermined down signal when an integrated value of the two integrators is greater than 0. The counter/register decreases or increases a count value by 1 according to the down signal or the up signal and stores predetermined information.

The predetermined information stored in the counter/register is in the form of a binary digital code of 4 bits and the two integrators are equivalent.

According to another aspect of the present invention, there is provided a digital duty cycle correction method. The digital duty cycle correction method comprises, (a) inverting a phase of an input clock signal by 180°; (b) detecting a rising edge of the inverted clock signal; and (c) generating a falling edge of a duty cycle corrected clock signal in response to the detected information.

The falling edge of the duty cycle corrected clock is generated from the rising edge of the clock that is 180° out of phase with the input clock in step (a).

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF THE INVENTION

Hereinafter, a digital duty cycle correction circuit for a multi-phase clock and method will be described in detail with reference to the accompanying drawings. In the description of the present invention, if detailed descriptions of related disclosed art or configuration are determined to unnecessarily make the subject matter of the present invention obscure, they will be omitted. Terms to be used below are defined based on their functions in the present invention and may vary according to users, user's intentions, or practices. Therefore, the definitions of the terms should be determined based on the entire specification.

Figure 1:
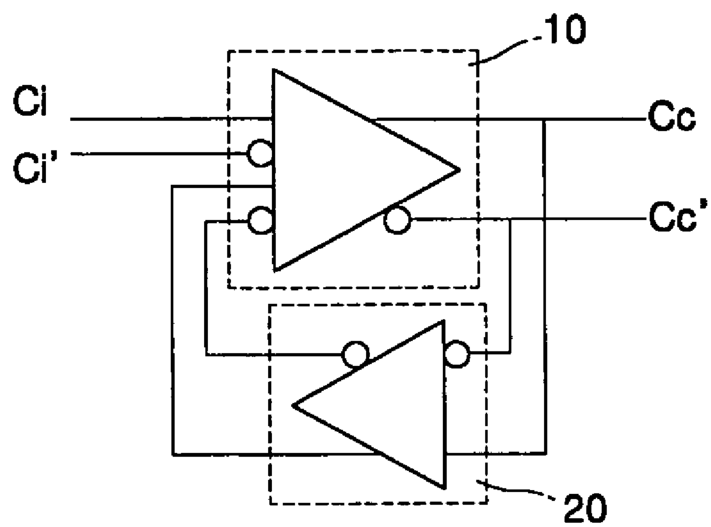
FIG. 1 is a circuit diagram of a conventional duty cycle correction circuit of FIG. 1.
Figure 2A:
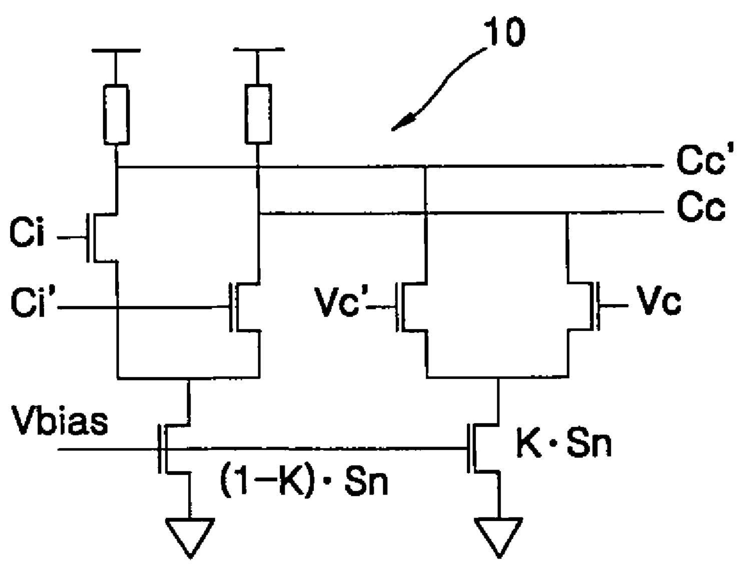
FIG. 2A is a circuit diagram of a duty cycle correction unit of the conventional duty cycle correction circuit of FIG. 1.
Figure 2B:
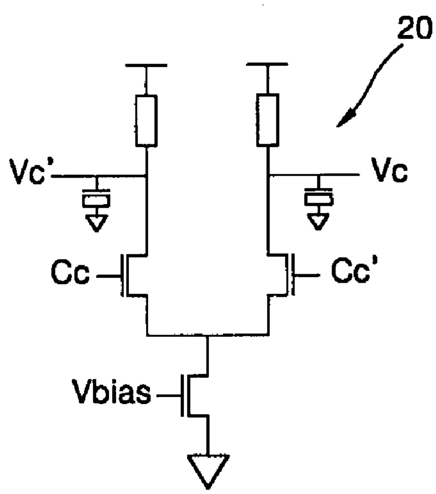
FIG. 2B is a detailed circuit diagram of a control voltage generation unit of the conventional duty cycle correction circuit.
Figure 3:
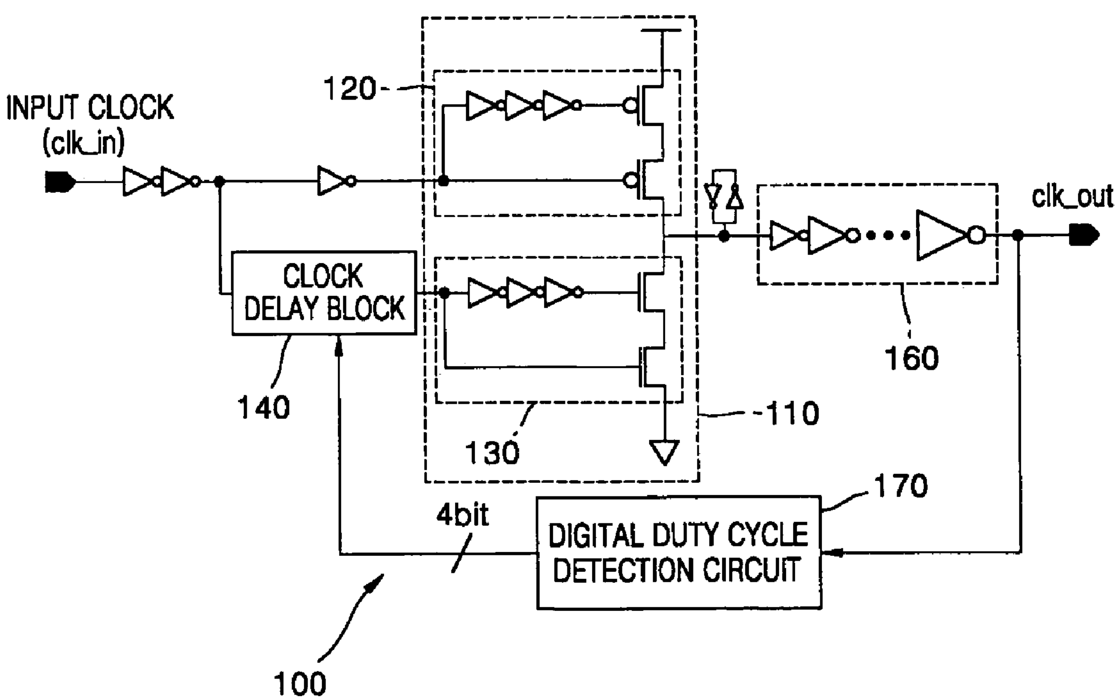
FIG. 3 is a circuit diagram of a digital duty cycle correction circuit of the digital duty cycle correction circuit for a multi-phase clock according to the present invention.
Figure 4:
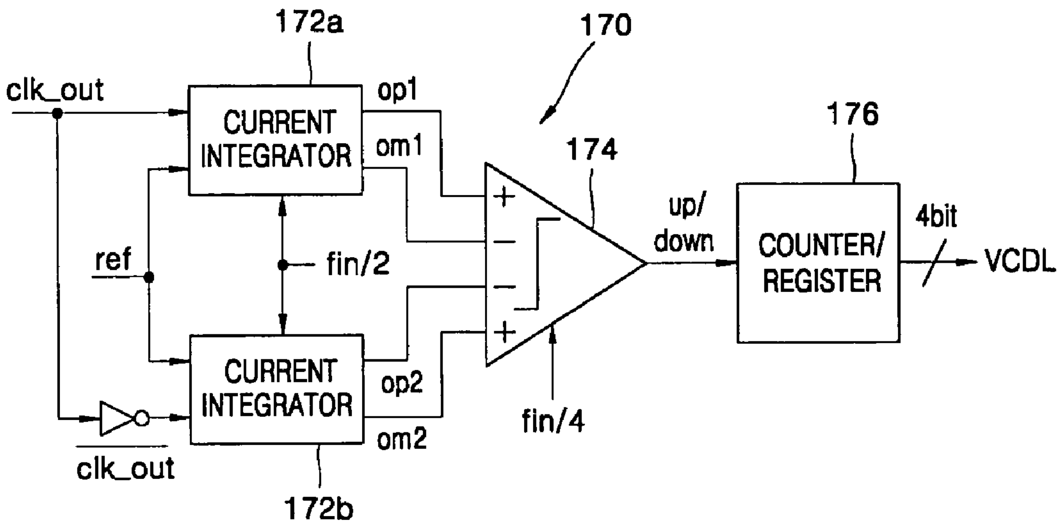
FIG. 4 is a circuit diagram of a digital duty cycle detection circuit of the digital duty cycle correction circuit of FIG. 3.
Figure 5:
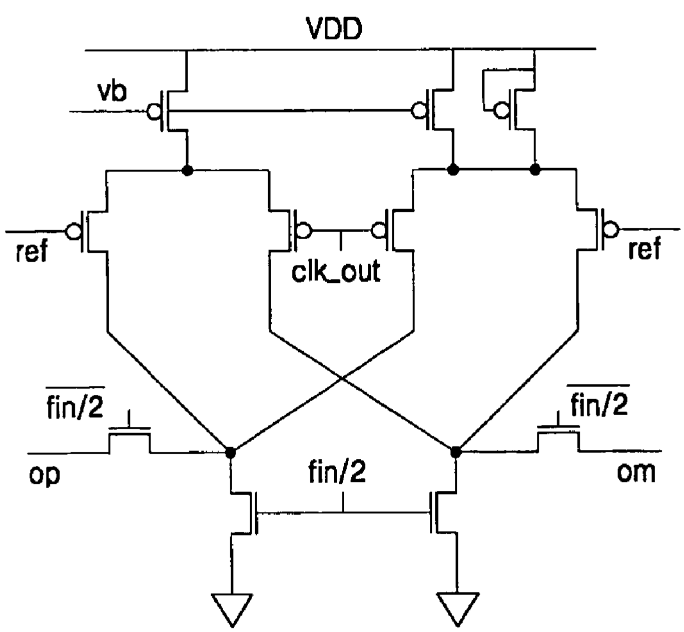
FIG. 5 is a circuit diagram of a current integrator used in the digital duty cycle detection circuit of FIG. 3.
Figure 6:
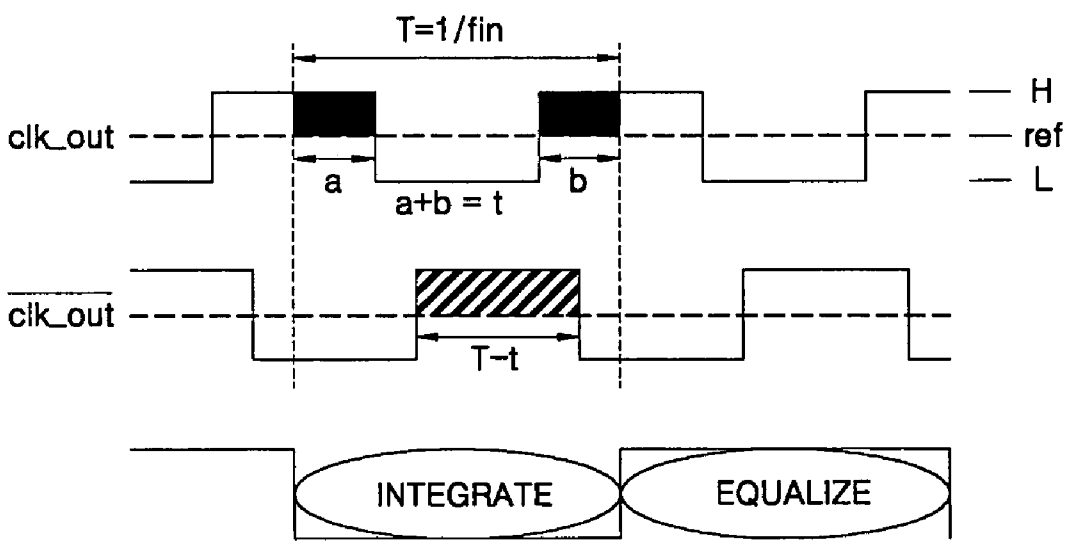
FIG. 6 is a timing diagram for the digital duty cycle detection circuit of FIG. 5.
Figure 7:
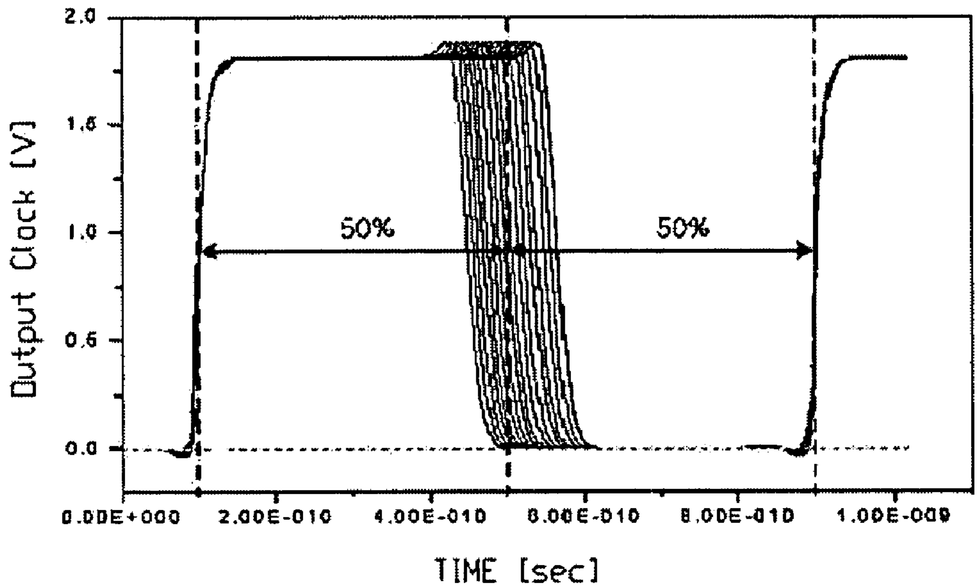
FIG. 7 is a graph illustrating a change in an output clock signal over time.
Figure 8:
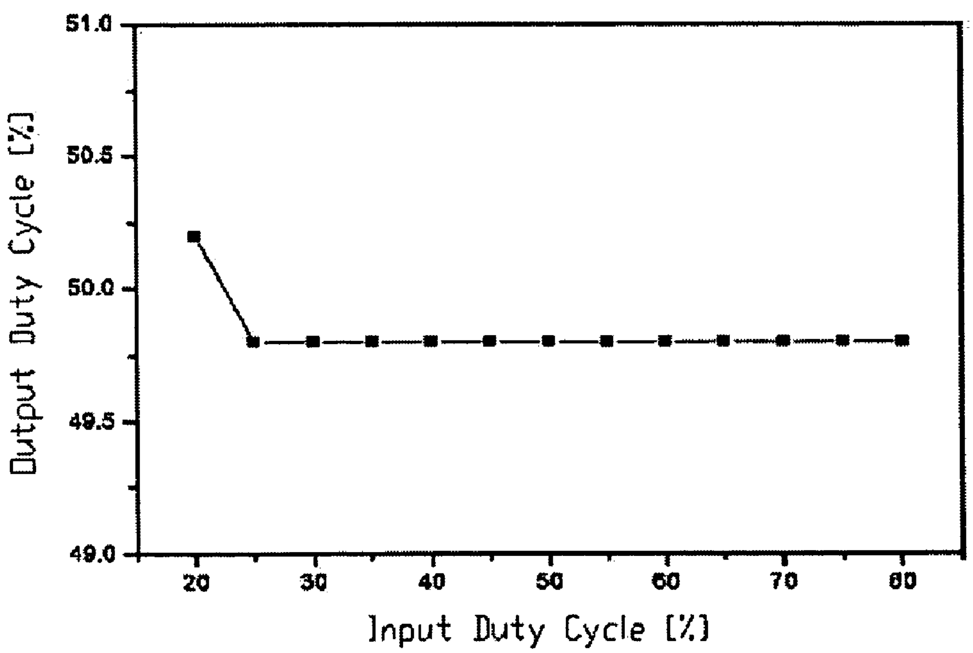
FIG. 8 is a graph illustrating a change in an output duty cycle with respect to a change in an input duty cycle.

FIG. 3 is a circuit diagram of a digital duty cycle correction circuit for a multi-phase clock according to an embodiment of the present invention, FIG. 4 is a circuit diagram of a digital duty cycle detection circuit of the digital duty cycle correction circuit of FIG. 3, FIG. 5 is a circuit diagram of a current integrator used in the digital duty cycle detection circuit of FIG. 4, FIG. 6 is a timing diagram of the digital duty cycle detection circuit, FIG. 7 is a graph illustrating a change in an output clock signal overtime, and FIG. 8 is a graph illustrating a change in an output duty cycle with respect to a change in an input duty cycle.

Referring to FIGS. 3 and 4, a digital duty cycle correction circuit 100 includes a clock generation block 110 that includes a clock rising edge generation block 120 and a clock falling edge generation block 130, a clock delay block 140, and a digital duty cycle detection unit 170 that includes current integrators 172*a* and 172*b*, a comparator 174, and a counter/register 176.

The clock rising edge generation block 120 detects a rising edge of an input clock signal clk_in and generates a rising edge of a duty cycle corrected clock signal. A clock signal that is 180° out of phase with the input clock signal clk_in is generated by the clock delay block 140 that takes the form of a shunt capacitor inverter and input to the clock falling edge generation block 130 which generates a falling edge of the duty cycle corrected clock. Here, the clock rising edge generation block 120 and the clock falling edge generation block 130 are included in a clock generation block 110. The clock generation block 110 can be a pseudo-$C^2$MOS-inverter which is smaller and has a higher operating speed than in a clock rising edge detection circuit and a clock falling edge detection circuit that use NAND logic.

The digital duty cycle correction circuit 100 detects the rising edge of the input clock signal clk_in and generates a fixed-delay rising edge of the duty cycle corrected clock signal compared to the input clock signal clk_in. Also, the falling edge of the duty cycle corrected clock signal is generated 180° out of phase from the rising edge of the input clock signal clk_in by the delay block 140. As such, since the rising edge of the duty cycle corrected clock signal is generated without a change in the phase of the rising edge from the input clock signal clk_in, phase information of each clock signal is not lost after completion of the duty cycle correction for a multi-phase clock.

Also, the digital duty cycle correction circuit 100 that only uses the rising edge of the input clock signal clk_in without using the falling edge of the input clock signal clk_in in clock duty cycle correction is not largely affected by the duty cycle of the input clock signal clk_in if the duty cycle that enables detection of the rising edge of the input clock signal clk_in is secured.

The duty cycle corrected clock signal clk_out is output to external devices by a clock driving circuit 160, and at the same time, is input to the digital duty cycle detection circuit 170. As a result, a feedback loop is formed. An embodiment of a detailed configuration of the digital duty cycle detection circuit 170 is shown in FIG. 4.

Referring to FIG. 4, the digital duty cycle detection circuit 170 outputs duty cycle information regarding a driving clock signal corresponding to a 50% duty cycle clock signal as a digital code. The digital code controls the delay block 140 and inverts the phase of the rising edge of the input clock signal clk_in by 180° thus generating the falling edge of the duty cycle corrected clock signal. The feedback loop is a negative-feedback loop and generates the 50% duty cycle clock signal.

The digital duty cycle detection circuit 170 of FIG. 4 includes the current integrators 172*a* and 172*b*, the comparator 174, and the counter/register 176. In the current integrators 172*a* and 172*b*, the difference between a clock signal and a reference voltage (ref=$V_{CLK\_SWING}/2$) is integrated during one period (1/fin). When an integrated value of the current integrators 172*a* and 172*b* is greater than 0, the comparator 174 generates an up signal, increases a count value of the counter/register 176 by 1, and stores the resultant count value in a register of the counter/register 176. A digital code stored in the counter/register 176 is preferably a binary digital code of 4 bits. Information that is corrected by the negative-feedback loop to have a clock duty cycle of 50% is stored in the counter/register 176. Thus, it is possible to store correction information in a power save state.

If a circuit offset or a change in the reference voltage occurs in one of the current integrators 172*a* and 172*b* used in the clock duty cycle detection circuit 170, it may be difficult to accurately generate a duty cycle of 50%. Thus, in the present invention, the identical current integrators 172*a* and 172*b* are used to integrate the difference between the driving clock signal clk_out and the reference voltage and the difference between the 180° inverted clock signal and the reference voltage, and compare the outputs of the current integrators 172*a* and 172*b*, thereby correcting the above-described problems. It is possible to compare the outputs of the current integrators 172*a* and 172*b* by using the comparator 174 with four inputs.

FIG. 5 illustrates the current integrators 172*a* and 172*b* of the digital duty cycle detection circuit 170 and FIG. 6 is a timing diagram illustrating the function of the two current integrators 172*a* and 172*b*. Here, if a swing fin/2 of a clock signal is small ($V_{fin/2}$=0), the current integrators 172*a* and 172*b* output values proportional to the difference between the driving clock signal and the reference voltage, and the difference between the 180° inverted clock signal and the reference voltage to output nodes op and om as differential voltage values. If swing fin/2 of the clock signal is large ($V_{fin/2}$=VDD), voltages at the output nodes op and om are 0V.

The following equation is obtained from the timing diagram of FIG. 6.

Integrated value of one period of clk_out=Integrated value of one period of $\overline{\text{clk\_out}}$ $$(H-\text{ref})\cdot t-(\text{ref}-L)\cdot(T-t)=(H-\text{ref})\cdot(T-t)-(\text{ref}-L)\cdot t2t\cdot(H-L)=T\cdot(H-L) \quad (1),$$

where T represents a period of a clock signal, t represents a period during which the clock signal is greater than a reference voltage (in this case, a duty cycle=t/T×100%), ref represents the reference voltage, H represents a voltage when the clock signal is greater than the reference voltage, and L represents a voltage when the clock signal is less than the reference voltage.

According to Equation 1, clock duty cycle detection is performed regardless of the reference voltage using 2t=T. Thus, it is possible to detect a duty cycle of 50% irrespective of a reference voltage using the current integrators 172*a* and 172*b* when the duty cycle of a clock signal is detected. Also, circuit offsets that may occur in the current integrators 172*a* and 172*b* can be reduced using the current integrators 172*a* and 172*b*.

FIG. 7 is a graph obtained by simulating a procedure of duty cycle correction of an input clock signal with a frequency of 1.25 GHz in which the phase of the rising edge of the input clock is held constant and only the phase of the falling edge of the input clock is not held constant. The characteristic illustrated by FIG. 7 makes it possible to perform duty cycle correction without changing the phase of a multi-phase clock signal.

FIG. 8 shows a simulation result of a change in the duty cycle of an output clock signal with respect to a change in the duty cycle of an input clock signal. Referring to FIG. 8 the digital duty cycle correction circuit according to the present invention can operate over a large range (about 15%–85% duty cycle for an input clock signal with a frequency of 1.25 GHz) without being largely affected by the duty cycle of the input clock signal if a duty cycle (about 15% duty cycle for an input clock signal with a frequency of 1.25 GHz) enables detection of the rising edge of the input clock. Also, since the digital duty cycle correction circuit corrects the duty cycle in a digital manner, a corrected duty cycle is held constant within an operating range.

As described above, the digital duty cycle correction circuit and method for a multi-phase clock are advantageous in that it is possible to correct the duty cycle of an input clock signal by changing the falling edge of the input clock signal without changing the rising edge of the input clock signal to correct the duty cycle of the input clock signal while maintaining phase information for each clock with respect to a multi-phase clock. Also, the digital duty cycle correction circuit is not largely affected by the duty cycle of the input clock signal.

In addition, by using a digital method for duty cycle correction of a multi-phase clock, the digital duty cycle correction circuit and method for a multi-phase clock can store information for the clock duty cycle correction even in a power save state and reduce power consumption of a clock system.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A digital duty cycle correction circuit comprising:

a clock rising edge generation means, which detects a rising edge of an input clock signal and generates a rising edge of a duty cycle corrected clock signal;

a clock falling edge generation means, which detects a rising edge of a clock signal that is 180° out of phase with the input clock signal and generates a falling edge of the duty cycle corrected clock signal based on the detected information;

a clock delay means, which inverts a phase of the input clock signal by 180° and inputs the inverted input clock signal to the clock falling edge generation means; and a clock driving circuit means that outputs and provides the duty cycle corrected clock signal to external circuits and a digital duty cycle detection circuit means that detects the duty cycle corrected clock signal output from the clock driving circuit means and inputs the duty cycle corrected clock signal to the clock delay means.

2. The digital duty cycle correction circuit of claim 1, wherein the duty cycle detection circuit means controls the clock delay means and outputs a predetermined digital code that inverts the phase of the rising edge of the input clock signal by 180° and generates the rising edge of the duty cycle corrected clock signal.

3. The digital duty cycle correction circuit of claim 1, wherein the duty cycle detection circuit means comprises:

two integrators, which integrate a difference between a predetermined clock signal and a reference voltage over one period of the predetermined clock signal;

a comparator, which generates a predetermined down signal when an integrated value of the two integrators is greater than 0; and a counter/register, which decreases or increases a count value by 1 according to the down signal or the up signal and stores predetermined information.

4. The digital duty cycle correction circuit of claim 3, wherein the predetermined information stored in the counter/register is in the form of a binary digital code of 4 bits.

5. The digital duty cycle correction circuit of claim 3, wherein the two integrators are equivalent.

* * * * *